US009778542B2

(12) United States Patent
Miller et al.

(10) Patent No.: US 9,778,542 B2
(45) Date of Patent: Oct. 3, 2017

(54) HIGH POWER VISIBLE LASER WITH A LASER-FABRICATED NONLINEAR WAVEGUIDE

(71) Applicant: DOLBY LABORATORIES LICENSING CORPORATION, San Francisco, CA (US)

(72) Inventors: Gregory David Miller, San Jose, CA (US); Gennady Imeshev, Irvine, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 0 days.

(21) Appl. No.: 15/318,593

(22) PCT Filed: Jun. 29, 2015

(86) PCT No.: PCT/US2015/038366
§ 371 (c)(1),
(2) Date: Dec. 13, 2016

(87) PCT Pub. No.: WO2016/003931
PCT Pub. Date: Jan. 7, 2016

(65) Prior Publication Data
US 2017/0131618 A1 May 11, 2017

Related U.S. Application Data

(60) Provisional application No. 62/019,601, filed on Jul. 1, 2014, provisional application No. 62/035,674, filed on Aug. 11, 2014.

(51) Int. Cl.
G02F 1/365 (2006.01)
H01S 5/00 (2006.01)
(Continued)

(52) U.S. Cl.
CPC .............. *G02F 1/365* (2013.01); *G02F 1/353* (2013.01); *G02F 1/3551* (2013.01);
(Continued)

(58) Field of Classification Search
None
See application file for complete search history.

(56) References Cited

U.S. PATENT DOCUMENTS 5,291,567 A 3/1994 Revelli, Jr.
6,631,231 B2 * 10/2003 Mizuuchi .............. G02F 1/3775
385/122

(Continued)

FOREIGN PATENT DOCUMENTS

EP 1462831 5/2008
WO 94/19713 9/1994

OTHER PUBLICATIONS

Xu, M. et al "Femtosecond Laser Micromachined Optical Waveguides in LiTaO3 Crystal" published on Aug. 28, 2013, Rapid Research Letters Physica Status Solidi RRL, pp. 1014-1017.
(Continued)

*Primary Examiner* — Uyen Chau N Le
*Assistant Examiner* — Chad Smith

(57) ABSTRACT

Novel methods and systems for waveguide fabrication and design are disclosed. Designs are described for fabricating ridge, buried and hybrid waveguides by a femtosecond pulsed laser. A laser system may combine a diode bar, a wavelength combiner and a waveguide. The waveguide may convert the electromagnetic radiation of an infrared laser into that the visible-wavelength range.

9 Claims, 4 Drawing Sheets

(51) Int. Cl.
*H01S 5/40* (2006.01)
*G02F 1/35* (2006.01)
*G02F 1/355* (2006.01)

(52) U.S. Cl.
CPC .......... *H01S 5/0092* (2013.01); *H01S 5/4025* (2013.01); *G02F 2201/063* (2013.01); *G02F 2202/20* (2013.01)

(56) References Cited

U.S. PATENT DOCUMENTS

| | | |
|---|---|---|
| 7,116,468 B2 | 10/2006 | Miller |
| 7,265,896 B2 | 9/2007 | Miller |
| 7,265,897 B2 | 9/2007 | Miller |
| 7,423,802 B2 | 9/2008 | Miller |
| 7,515,801 B2 | 4/2009 | McCaughan |
| 8,270,788 B2 | 9/2012 | Herman |
| 2007/0297732 A1 | 12/2007 | Mason |
| 2008/0025350 A1 | 1/2008 | Arbore |

OTHER PUBLICATIONS

Burghoff, J. et al "Origins of Waveguiding in Femtosecond Laser-Structured LiNbo3" Applied Physics, Oct. 2007, vol. 89, Issue 1, pp. 127-132.

Dong, L. et al "All-Glass Large-Core Leakage Channel Fibers" IEEE Journal of Selected Topics in Quantum Electronics, vol. 15, No. 1, Jan./Feb. 2009, pp. 47-53.

Fu, L. et al "Extremely Large Mode Area Optical Fibers Formed by Thermal Stress" vol. 17, Issue 14, pp. 11782-11793, Jul. 6, 2009.

\* cited by examiner

HIGH POWER VISIBLE LASER WITH A LASER-FABRICATED NONLINEAR WAVEGUIDE

CROSS REFERENCE TO RELATED APPLICATIONS

This application claims priority to U.S. Provisional Patent Application No. 62/019,601, filed on Jul. 1, 2014 and U.S. Provisional Patent Application No. 62/035,674, filed on Aug. 11, 2014, each of which is hereby incorporated by reference in its entirety.

TECHNICAL FIELD

The present disclosure relates to optical waveguides. More particularly, it relates to a high power visible laser with a laser-fabricated nonlinear waveguide.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

Figure 1:
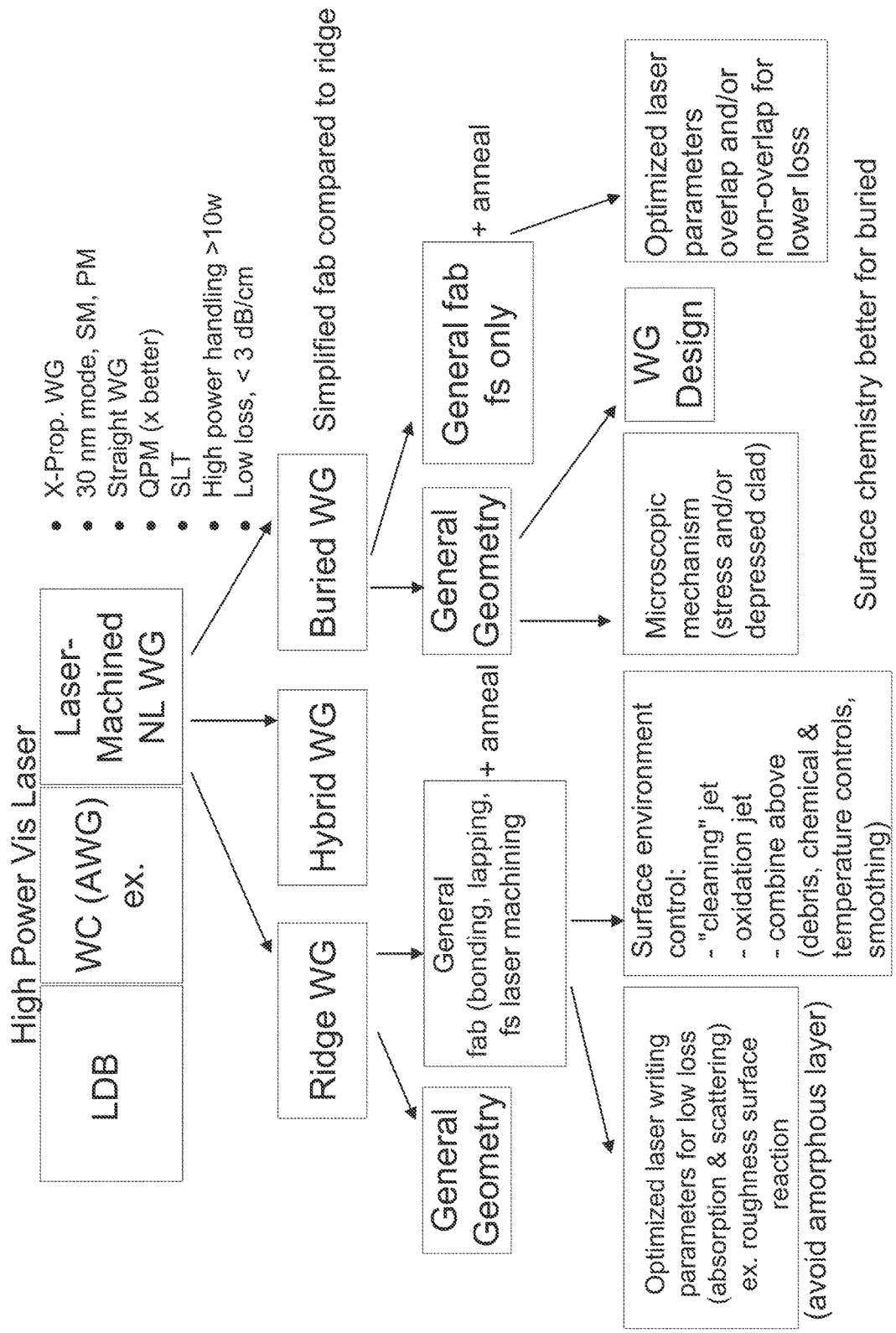
FIG. 1 illustrates an exemplary process for ridge, buried and hybrid waveguide designs.

In a first aspect of the disclosure, a wavelength-converting nonlinear ridge waveguide is described, the wavelength-converting nonlinear ridge waveguide comprising: a nonlinear crystal substrate; a first dielectric layer on a top surface of the nonlinear crystal substrate; a waveguide layer on a top surface of the first dielectric layer, the waveguide layer comprising at least one laser-fabricated ridge region, the at least one laser-fabricated ridge region being configured to allow formation of an optical mode, the optical mode substantially delimited by the at least one laser-fabricated ridge region and the first dielectric layer; and a second dielectric layer on a top surface of the waveguide layer.

In a second aspect of the disclosure, a wavelength-converting nonlinear buried waveguide is described, the wavelength-converting nonlinear buried waveguide comprising: a nonlinear crystal substrate; and a plurality of laser-fabricated damage tracks in the nonlinear crystal substrate, wherein the plurality of laser-fabricated damage tracks have a crystalline structure different from an undamaged crystalline structure of the nonlinear crystal substrate, the plurality of laser-fabricated damage tracks being arranged in a desired pattern configured to allow formation of an optical mode within an area of the nonlinear crystal substrate substantially delimited by the desired pattern.

In a third aspect of the disclosure, a wavelength-converting nonlinear hybrid waveguide described, the wavelength-converting nonlinear hybrid waveguide comprising: a nonlinear crystal substrate; a layer of laser-fabricated damage tracks in the nonlinear crystal substrate, wherein the laser-fabricated damage tracks have a crystalline structure different from an undamaged crystalline structure of the nonlinear crystal substrate; at least one laser-fabricated ridge region on a top surface of the nonlinear crystal substrate, the at least one laser-fabricated ridge region being configured to allow formation of an optical mode, the optical mode substantially delimited by said at least one laser-fabricated ridge region and the layer of damage tracks; and a dielectric layer on a top surface of the nonlinear crystal substrate.

DETAILED DESCRIPTION

Low-cost, high-power visible laser sources are an important component for the next generation cinema projectors. The present disclosure describes methods for the fabrication of such a laser. The laser is based on a laser diode bar, a wavelength combiner and a wavelength-converting nonlinear waveguide fabricated using femtosecond (fs) laser writing techniques. Laser diode bars, wavelength combiners and wavelength-converting nonlinear waveguide fabricated using plasma etching as well as their combination are described for example in U.S. Pat. No. 7,423,802 B2, U.S. Pat. No. 7,265,896 B2, U.S. Pat. No. 7,265,897 B2, U.S. Pat. No. 7,116,468 B2, US 20070297732 A1, US 20080025350 A1, the disclosure of all of which is incorporated herein by reference in their entirety. Various designs of wavelength-converting nonlinear waveguide fabricated using fs laser writing techniques are described for example in Xu et al., Phys. Status Solidi RRL 7(11) (2013) 1014-1017, Burghoff et al., Appl. Phys. A 89, 127-132 (2007), Dong et al., IEEE Journal Of Selected Topics In Quantum Electronics, Vol. 15, No. 1, January/February 2009, Fu et al., Optics Express, Vol. 17, No. 14, 6 Jul. 2009, p. 11782, the disclosure of all of which is incorporated herein by reference in their entirety. However, such designs are of limited utility for making large-mode-area, single-mode (or nearly-single-mode), low loss waveguides that can be produced in volume.

A laser source in the visible wavelength range, as described in the present disclosure, comprises of an infrared laser light source (or sources), comprising in several embodiments a laser diode bar. The output of the laser diode can be coupled to input ports of a wavelength combiner (e.g. an arrayed waveguide grating) that directs laser radiation to a single output port, for example, a single-mode waveguide. A wavelength-converting (frequency-doubling) nonlinear waveguide can then convert the infrared radiation into the visible spectral range. The wavelength combiner and/or the nonlinear waveguide can provide optical feedback to the laser diode, stabilizing operation of each emitter at its own wavelength.

The nonlinear waveguide can be fabricated using fs laser writing techniques. This allows for a better performance and lower production costs compared to plasma-etching of waveguides and compared to other systems. The nonlinear waveguide can be fabricated on a stoichiometric (or nearly stoichiometric) lithium tantalite substrate (SLT). SLT has a high nonlinear optical coefficient and allows for efficient wavelength conversion and high power handling capabilities (>10 W). For high conversion efficiency, the substrate can be z-cut (x-cut and y-cut could also be used) and may have a quasi-phase-matching grating (with an appropriately-chosen period) that could be fabricated using common methods. The waveguide direction can be along the y-axis of the substrate. However, waveguides oriented along the x-axis could also be used. Moreover, curved or other non-straight waveguides or waveguide circuits can be used as well. The waveguide can support single-mode (or nearly-single-mode) operation at the diode laser wavelength and/or frequency-doubled wavelength. The supported mode diameter is 15-50 um, preferably 30 um (um being micrometers). The waveguide propagation loss can be <3 dB/cm, for example <1 dB/cm, or <0.3 dB/cm.

Three types of embodiments for a waveguide design type are described in the present disclosure, a ridge waveguide, a buried waveguide, and a hybrid waveguide.

Figure 2:
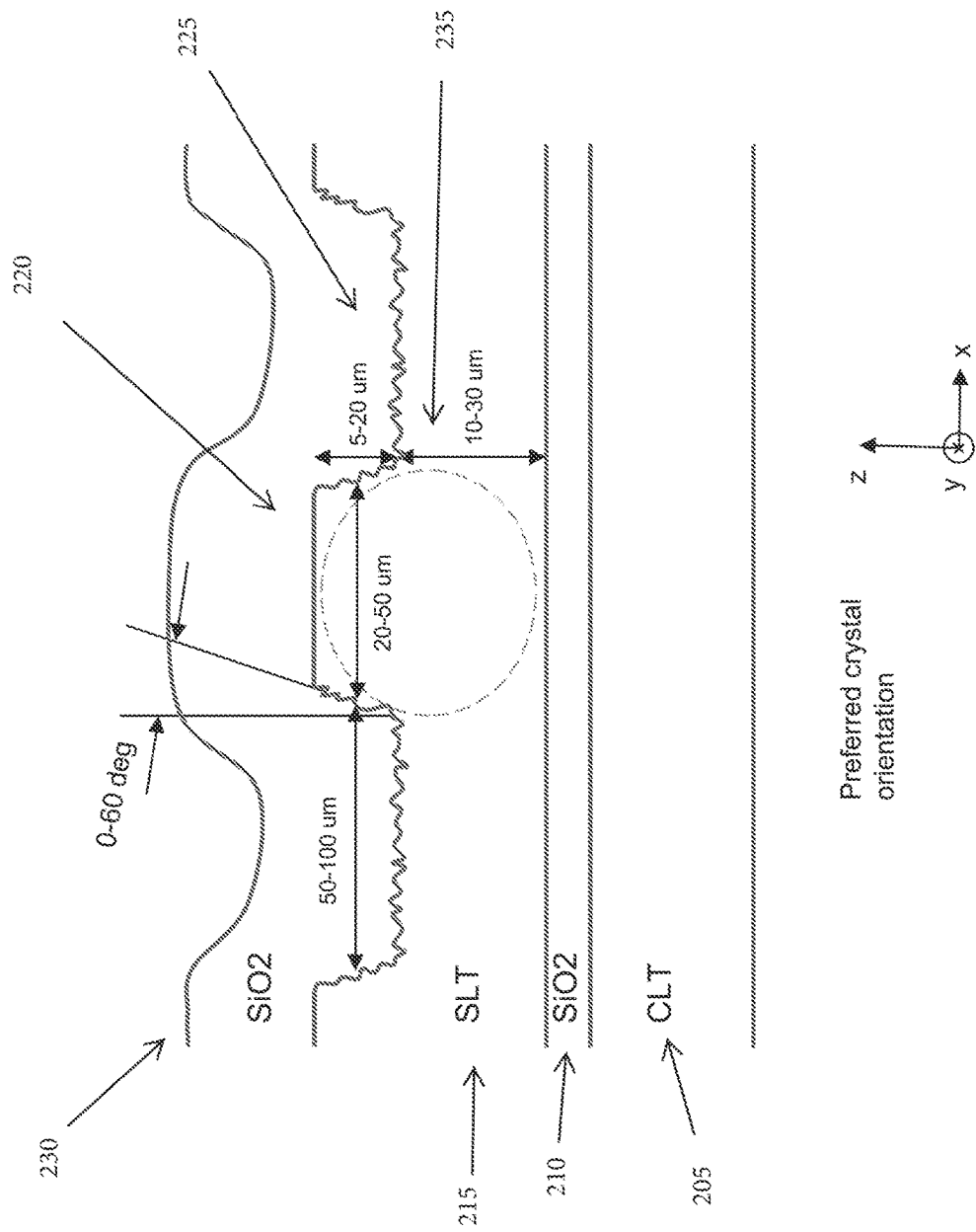
FIG. 2 illustrates an exemplary ridge waveguide.

The cross-section of an exemplary ridge waveguide is shown schematically in FIG. 2. Congruent lithium tantalite (CLT) substrate (205) is coated with a thin layer of silica (SiO2), (210). SLT (215) is then bonded on top and subsequently lapped uniformly across the surface to a thickness of 15-50 um. Femtosecond laser processing is then used to remove 5-20 um of material from the top surface to leave a long ridge (220) that is 5-20 um high and 20-50 um wide. The ablated zone (225) extends 50-100 um or more away from the ridge on both sides. The whole structure can then be overcoated with SiO2. Optionally, an additional annealing and/or plasma etching step can be performed to improve propagation losses.

In some embodiments, the substrate can be z-cut stoichiometric periodically-poled lithium tanatalate (SLT). In some embodiments, the roughness can be <100 nm root mean square (rms), that is, the sidewall and the floor extend to 50-100 um or more outside of the ridge (220).

The ridge structure as described, for example, in FIG. 2 can support a single-mode (or nearly single-mode) operation if the ridge height and width are chosen appropriately. The mode is shown schematically in FIG. 2 as a dotted line (235). For simplicity, an elliptical line (235) is drawn, whereas a real mode can exhibit a more complicated profile.

Propagation loss in the ridge waveguide is caused by scattering due to roughness and absorption. A roughness of <100 nm rms can be achieved on the laser processed surfaces and is advantageous for the operation of the device. Chemical reduction of the processed surfaces may cause excessive roughness, in contrast to the physical processing caused by a laser application. Amorphization of the SLT substrate can also be advantageously minimized or avoided during laser processing. For low propagation loss, fs laser processing can be carefully optimized among the following parameters: scan speed, overlap, number of passes, pulse length, repetition rate, wavelength, polarization, focusing conditions, and others. In some embodiments, only the ridge of the waveguide is fabricated by a pulsed laser.

Additionally, during fs laser processing, surface environment controls can be used to remove debris, improve roughness, control temperature and chemical composition, Such controls can be implemented via one or more jets of oxygen, ozone, nitrogen, air or other gasses.

The person skilled in the art will understand that the example of FIG. 2 may be modified to obtain different variants of ridge structures.

Figure 3:
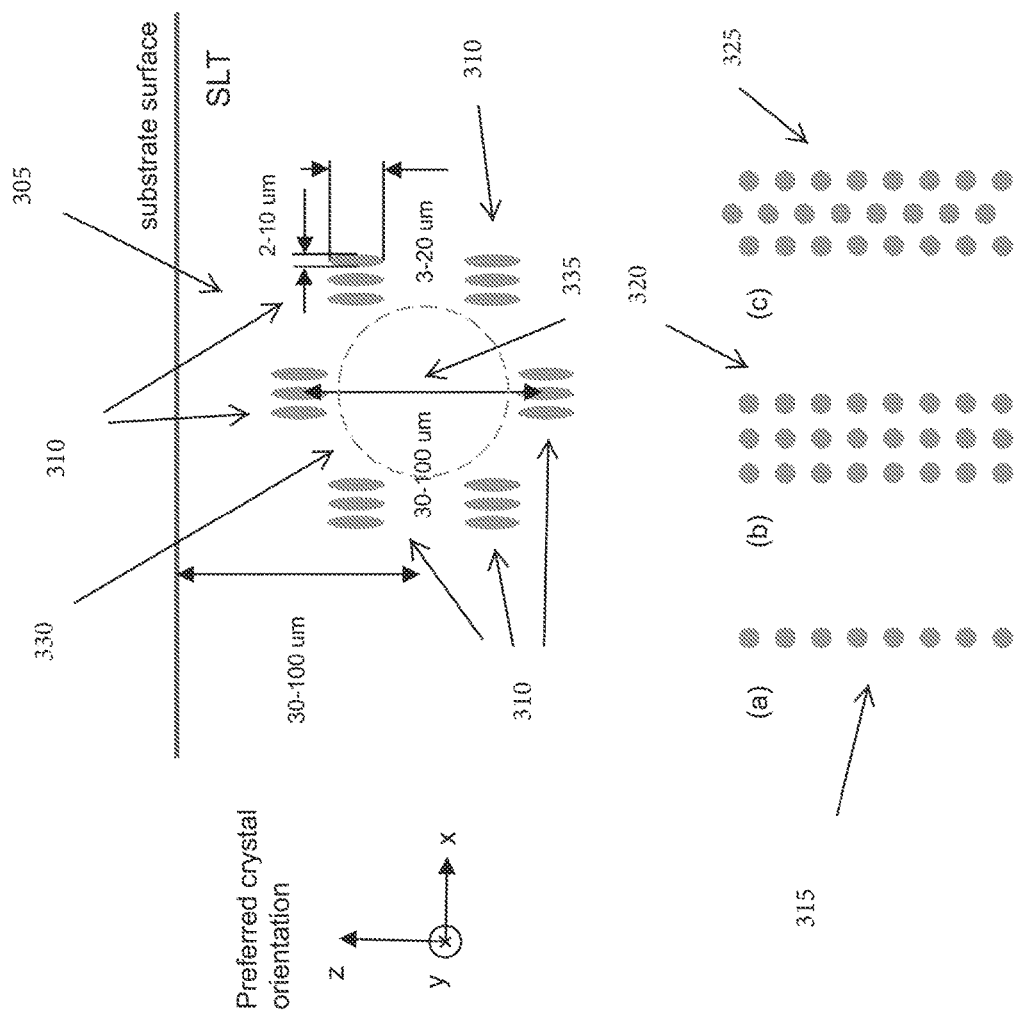
FIG. 3 depicts an exemplary buried waveguide.

The cross-section of an exemplary buried waveguide is shown schematically in FIG. 3. The waveguide structure is written directly in the substrate material. Fabrication process for the buried waveguide can be greatly simplified compared to the ridge waveguide of FIG. 2, as several critical and involved processing steps can be eliminated.

A permanent material damage can occur when a laser pulse (from a fs laser) with uJ-level energy is focused under the surface of the substrate (305) to a spot with a diameter of few microns (uJ being micro Joule). The damage spot can have an oblong shape (see for example 310), about 2 by 10 um in size (or in the range of 2-10 um by 3-20 um). The fs laser beam (or the substrate (305)) can be translated perpendicular to the beam propagation direction, resulting in a continuous or discrete damage track, see for example (315, 320, 325).

In other words, a plurality of damage tracks (310) can be traced in a pattern which constitutes a waveguide.

The refractive index of the material is decreased within the track, compared to the index of the substrate (305). In the vicinity of the track the index is increased due to stress, as the mechanical stress deforming the crystal lattice will change its properties, such as the refractive index.

A waveguide structure can be formed by arranging many closely-spaced damage tracks in a circular pattern, with spacing between the tracks comparable to the individual track size.

The optical mode (330) is situated in the undamaged substrate material inside the damage ring, that is the circular pattern formed by individual damage tracks. Such waveguides are termed as depressed cladding or Type III waveguides. While such waveguide designs support single-mode operation for small damage ring diameters, the waveguides become multi-moded for larger diameters. The person skilled in the art will understand that, for high power applications, single-mode operation and large mode diameters (>20 um, preferably >30 um) are required.

Optical fibers, large-pitch leakage-channel fiber designs can be used to extend single-mode operation to large mode diameters. In such designs, reduced-index rods (few 10 s of microns in diameter) are placed around the fiber core, effectively suppressing propagation of higher-order modes. Stress-induced guiding in optical fibers can be used to extend single-mode operation to large mode diameters.

In the embodiments exemplified by FIG. 3, damage tracks can be arranged in a circular or non-circular pattern, and can be regularly or non-regularly spaced. One or more rings of damage tracks can be used. In FIG. 3, the center of the waveguide core (335) can be 30-100 um below the substrate surface and the diameter of the damage ring (inside the ring of tracks (310)) can be 30-100 um. The optical mode (330) is situated in the undamaged substrate material inside the damage ring (inside the ring of tracks (310)). The optical mode is shown schematically in FIG. 3 as a dotted line (330). For simplicity, a circular line is drawn, whereas a real mode can exhibit a more complicated profile. In some embodiments, the substrate may be transparent to the machining laser, in order to avoid absorbance of the laser from the substrate.

Damage tracks (310) can be arranged in groups of 1-10 or more tracks. Within each group the tracks can be placed in proximity of each other, with separation comparable to the track size. This leads to an effective refractive index reduction over the area occupied by the group. The groups can be separated by a larger distance (comparable to the size of the group) to suppress higher-order mode propagation, similarly to large-pitch leakage channel fiber designs. In some embodiments, 4 to 36 or more groups can be used.

Alternatively, a stress-induced increase of the refractive index in the vicinity of damage tracks can be effectively used to form a waveguide. This can be achieved by placing damage tracks around the undamaged core, thereby causing an increase in the refractive index of the undamaged core, due to the stress in the crystal lattice. Placement of the damage tracks, their strength and the resulting stress distribution can be optimized for single-mode, large mode diameter waveguide operation. The stress distribution around a damage track can generally be anisotropic. It is advantageous to take the anisotropicity into account in the waveguide design. In such designs, the optical mode field can be effectively pushed away from the damage tracks. This can result in reduced propagation loss as well as in improved nonlinear conversion efficiency.

Yet another alternative is to utilize both leakage-channel and stress-induced guidance to achieve low loss, single-mode, large mode diameter waveguide operation.

The overall process of fabricating buried waveguides may comprise creating damage tracks under the substrate surface with a fs laser. An additional annealing step can be used to improve the waveguide performance. Such fabrication process for the buried waveguide can be greatly simplified compared to the ridge waveguide fabrication. Several critical processing steps as well as some capital equipment are eliminated. Also, since there is no surface ablation during buried waveguide fabrication, there is no need to control a complicated surface chemistry.

The fs laser processing parameters can be selected to produce a strong reproducible damage track while avoiding material fracture at and around the track. To obtain the best waveguide performance, the parameters can be carefully optimized among the following: scan speed, overlap, number of passes, pulse length, repetition rate, wavelength, polarization, focusing conditions, and others.

In the embodiments above, the fabrication of continuous damage tracks has been described, as can be done by overlapping damage spots produced by individual fs pulses. Alternatively, effective damage tracks can be produced by placing individual non-overlapping damage spots in a regular pattern along the waveguide direction, as shown in FIG. 3. Exemplary patterns (315, 320, 325) as depicted in FIG. 3 may all be used, as well as other variations as understood by the person skilled in the art. A regular pattern of damage spots has well-defined spatial frequencies with low losses between the peaks. Appropriate choice of spacing between the damage spots can lead to a lower waveguide propagation loss. Such arrangements can also be used in the fabrication of hybrid waveguides described below.

The substrate in FIG. 3 can be z-cut stoichiometric periodically-poled lithium tanatalate.

Figure 4:
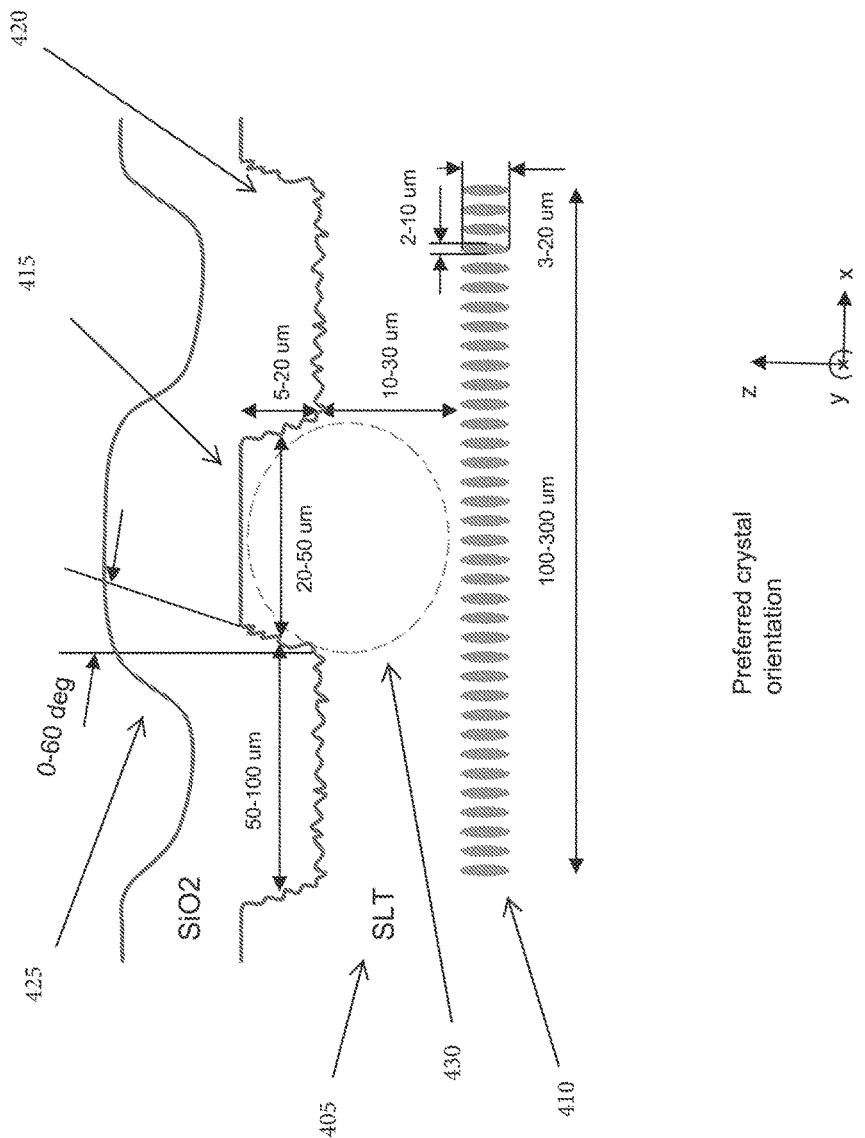
FIG. 4 depicts an exemplary hybrid waveguide.

The cross-section of an exemplary hybrid waveguide is shown schematically in FIG. 4. In a first step, an array of damage tracks can be produced using a fs laser at, for example, a depth of 15-50 um below the surface of a SLT substrate (405). The tracks collectively amount to a plane of damaged material (410) that is 100-300 um or more wide. The tracks can be regularly or non-regularly spaced. In some embodiments, the tracks are placed in proximity of each other, with a separation comparable to the track size. Alternatively, the tracks can be arranged in groups of 1-10 or more tracks with a larger separation between the adjacent groups (comparable to the size of the group). This can be advantageous for further suppression of the propagation of higher-order modes.

In a second step, fs laser processing can be used to remove 5-20 um of material from the top surface to leave a long ridge (415) that is 5-20 um high and 20-50 um wide. The ablated zone (420) can extend 50-100 um or more away from the ridge on both sides. The whole structure can then be overcoated with SiO2 (425). Optionally, an additional annealing and/or plasma etching step can be performed to improve waveguide performance. In some embodiments, a roughness of <100 nm rms can be achieved on the laser processed surfaces in the second step. In some embodiments, chemical reduction of the processed surfaces can be minimized or avoided. Amorphization of the SLT substrate can also be minimized or avoided during laser processing. Additionally, during the second step, surface environment controls can be used to remove debris, improve roughness, control temperature and chemical composition, Such controls can be implemented via one or more jets of oxygen, ozone, nitrogen, air or other gasses.

The waveguide mode is situated in the undamaged substrate material, as shown schematically in FIG. 4 as a dotted line (430). For simplicity, an elliptical line is drawn in FIG. 4, whereas a real mode exhibits a more complicated profile.

Alternatively, a hybrid waveguide can be fabricated by first producing a plane of damaged material using the same process as described above. In the second step, plasma etching, instead of laser ablation, can be used to fabricate the ridge structure.

To obtain the best waveguide performance, the fs laser processing parameters can be carefully optimized separately for both steps among the following: scan speed, overlap, number of passes, pulse length, repetition rate, wavelength, polarization, focusing conditions, and others.

Fabrication process for the buried waveguide can be simplified compared to the ridge waveguide, as bonding and lapping steps are eliminated.

As the person skilled in the art will understand, the fs laser processing steps for both ablation and damage track formation described above could alternatively use few-picosecond pulses and even longer pulses, up to few nanoseconds, and still achieve required waveguide performance. For example, the use of sub-nanosecond pulses in the UV spectral range (ex. at about 355 nm) can allow the achievement of low damage/ablation processing thresholds.

Ridge, buried and hybrid waveguide designs as described in the present disclosure can be constructed on a stoichiometric (or nearly stoichiometric) lithium tantalite substrate. It is understood that such waveguides can be constructed on other nonlinear substrates (for example, congruent lithium tantalite, lithium niobate, KTP, BBO, LBO, BiBO, etc.). It is further understood that such waveguides can be contracted on other crystalline, non-crystalline or ceramic; doped or undoped substrates (Nd:YAG, glass, etc).

FIG. 1 describes an exemplary process for ridge, buried and hybrid waveguide designs as described in the present disclosure. For example, lapping, bonding and fs laser machining may be used to fabricate the waveguides.

The surface of the devices, prior or during fabrication, may be cleaned with various methods, such as cleaning or oxidation jets. For example, an oxidation jet may be a jet of reactive gases which clean the surface of the substrate by chemical reactions with surface contaminants and/or debris.

The waveguides fabricated according to the methods and designs of the present disclosure may be used to fabricate a laser system. The laser system may comprise a laser based on an infra-red diode bar, and a laser-fabricated waveguide. The waveguide can be used for the frequency conversion of the infrared laser into the visible wavelength. Such laser-fabricated waveguides can offer better performance and lower production costs compared to plasma-etched waveguides. The laser system may also include a wavelength combiner, for example a waveguide grating, such as an arrayed waveguide grating.

As understood by the person skilled in the art, a diode bar is an array of diodes.

As understood by the person skilled in the art, arrayed waveguide gratings can be used as optical multiplexers in wavelength division multiplexed systems. Arrayed waveguide gratings multiplex a number of wavelengths into a single optical waveguide, thereby increasing the transmission capacity of an optical channel.

The arrayed waveguide gratings are based on a fundamental principle of optics that light waves of different wavelengths interfere linearly with each other. For example, if each diode in a diode bar emits light of a slightly different wavelength, then the light from a large number of these channels can be carried by a single optical waveguide (channel) with negligible crosstalk between the channels.

In some embodiments, the geometry of the waveguides of the present disclosure is configured to support single-mode (or nearly-single-mode) operation. The processing parameters (including, but not limited to fs laser processing parameters) are optimized for waveguide performance. The fs laser processing parameters are optimized among the following parameters: scan speed, overlap, number of passes, pulse length, repetition rate, wavelength, polarization, focusing conditions, and others.

In some embodiments, depending on the wavelength of the machining laser, the substrate may be transparent or absorbing for some or all of the fabrication steps. It may be advantageous to use a shorter wavelength, for example, to obtain a smoother surface for ridges in a hybrid waveguide (compared to other process steps, such as damage track formation).

In some embodiments, the substrate does not need to be transparent. For example, for a ridge waveguide, the substrate does not need to be transparent for the machining laser. In other embodiments, the substrate may need to be transparent. For example, for a ridge waveguide, it may be possible to create the ridges on one side (for example, the front side) with a laser illuminated through the substrate from the other side (e.g., the back side). In another example, for a hybrid waveguide, the same laser can be used to create the ridges and damage tracks from the backside of the substrate. This method can allow the substrate to be mounted once to the fixture, thus improving design tolerances.

In several embodiments, a smooth ridge surface may be desirable. However, the ridge surface may be rough due to process of fabrication. In order to improve smoothness (and desired planarity characteristics), it is possible to pre-treat or post-treat the surface of the material to be laser-machined. For example, a pre-treatment may comprise a metallization step, or painting step with a compound. The pre-treatment can provide local absorption of the machining laser (which focuses the energy to the top surface).

Post-treatment may comprise chemical etching for smoother (or more uniform) surface. Etching may comprise, for example, the use of HF (hydrofluoric acid), nitric acid (HNO3), ammonium fluoride (NH4F) and/or potassium hydroxide (KOH), ethylene diamine, tetramethylammonium hydroxide (TMAH). Plasma etching (e.g. chlorine or fluourine), may also be used for smoothing a surface. For example, fluorocarbon (CF4) may be used for smoothing ridges.

Several references are cited in the present disclosure, the disclosure of all said references is incorporated herein by reference in their entirety.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A wavelength-converting nonlinear buried waveguide comprising:
    a nonlinear crystal substrate; and
    a plurality of laser-fabricated damage tracks in the nonlinear crystal substrate, wherein the plurality of laser-fabricated damage tracks have a crystalline structure different from an undamaged crystalline structure of the nonlinear crystal substrate, the plurality of laser-fabricated damage tracks being arranged in a desired pattern configured to allow formation of an optical mode within an area of the nonlinear crystal substrate substantially delimited by the desired pattern.

2. The wavelength-converting nonlinear buried waveguide of claim 1, wherein the plurality of laser-fabricated damage tracks is at a depth between 30 and 150 micrometers from a top surface of the nonlinear crystal substrate.

3. The wavelength-converting nonlinear buried waveguide of claim 1, wherein a width of one damage spot is between 2 and 10 micrometers.

4. The wavelength-converting nonlinear buried waveguide of claim 1, wherein the desired pattern is substantially circular.

5. The wavelength-converting nonlinear buried waveguide of claim 1, wherein the desired pattern comprises at least one row of damage tracks along a direction of propagation of an optical wave transmitted by the wavelength-converting nonlinear buried waveguide.

6. A method to fabricate the wavelength-converting nonlinear buried waveguide of claim 1, the method comprising damaging a region of the nonlinear crystal substrate with a pulsed laser, thereby obtaining the plurality of laser-fabricated damage tracks.

7. The method of claim 6, wherein the pulsed laser is a femtosecond laser.

8. The method of claim 6, wherein a scan speed, overlap, number of passes, pulse length, repetition rate, wavelength, polarization, or the focusing conditions of the pulsed laser are optimized for a waveguide performance.

9. The method of claim 6, wherein the nonlinear crystal substrate is transparent to the pulsed laser, thereby allowing fabrication from either side of the nonlinear crystal substrate.

* * * * *